US008048706B1

(12) United States Patent
Ghandour et al.

(10) Patent No.: US 8,048,706 B1
(45) Date of Patent: Nov. 1, 2011

(54) ABLATIVE SCRIBING OF SOLAR CELL STRUCTURES

(75) Inventors: Osman Ghandour, Morgan Hill, CA (US); Alex Austin, Carmel Valley, CA (US); Daebong Lee, Sunnyvale, CA (US); Jason Stephen Corneille, San Jose, CA (US); James Teixeira, San Jose, CA (US)

(73) Assignee: Miasole, Santa Clara, CA (US)

( * ) Notice: Subject to any disclaimer, the term of this patent is extended or adjusted under 35 U.S.C. 154(b) by 0 days.

(21) Appl. No.: 12/904,922

(22) Filed: Oct. 14, 2010

(51) Int. Cl.
H01L 21/00 (2006.01)

(52) U.S. Cl. .......... 438/57; 438/676; 438/463; 257/431; 257/E27.124; 257/E21.238; 136/244

(58) Field of Classification Search .................. None
See application file for complete search history.

(56) References Cited

U.S. PATENT DOCUMENTS

| 4,994,639 | A | 2/1991 | Dickinson et al. |
| 5,593,901 | A | 1/1997 | Oswald et al. |
| 6,341,029 | B1 | 1/2002 | Fillion et al. |
| 6,919,162 | B1 | 7/2005 | Brennen et al. |
| 2010/0062560 | A1 * | 3/2010 | Farris et al. ............ 438/68 |

OTHER PUBLICATIONS

Huber et al. "High speed structuring of CIS thin-film solar cells with picosecond laser ablation" Proc. SPIE 7203, 72030R (2009); doi10.1117/12.812332.*

U.S. Appl. No. 12/904,944, "Dithered Scanned Laser Beam for Scribing Solar Cell Structures", Osman Ghandour, filed Oct. 14, 2010.
U.S. Appl. No. 12/904,958, "Partially Transmitted Imaged Laser Beam for Scribing Solar Cell Structures", Osman Ghandour, filed Oct. 14, 2010.
Jacobs, Geoff, "Understanding Spot Size for Laser Scanning", Professional Surveyor Magazine, Oct. 2006, 2 pages.
Patel, Rajesh, et al., "Why Pulse Duration Matters in Photovoltaics: Short Pulses for More Robust, Higher Quality Laser Scribes," Photovoltaics, No. 1, Jan. 2010, pp. 21-24.
Gordillo, G., et al., "Optical and Structural Characterization of $CuInSe_2$ (CIS) Thin Films Grown by Means of Process in Two Stages", Superficies y Vacio, Jun. 2003, vol. 16, No. 2, 5 pages.
Zengir, Bengul, et al., "Optical Absorption in Polyerystalline CdTe Thin Films", Jornal of Arts and Sciences, May 5, 2006, pp. 103-116.

* cited by examiner

Primary Examiner — Ha Tran T Nguyen
Assistant Examiner — Shaka Scarlett
(74) Attorney, Agent, or Firm — Weaver Austin Villeneuve & Sampson LLP

(57) ABSTRACT

Provided herein are improved methods of laser scribing photovoltaic structures to form monolithically integrated photovoltaic modules. The methods involve forming P1, P2 or P3 scribes by an ablative scribing mechanism having low melting, and in certain embodiments, substantially no melting. In certain embodiments, the methods involve generating an ablation shockwave at an interface of the film to be removed and the underlying layer. The film is then removed by mechanical shock. According to various embodiments, the ablation shockwave is generated by using a laser beam having a wavelength providing an optical penetration depth on the order of the film thickness and a minimum threshold intensity. In one embodiment, material including an absorber layer is scribed using an infrared laser source and a picosecond pulse width.

24 Claims, 8 Drawing Sheets

ABLATIVE SCRIBING OF SOLAR CELL STRUCTURES

BACKGROUND OF THE INVENTION

Photovoltaic cells are widely used for generation of electricity, with multiple photovoltaic cells interconnected in module assemblies. Such modules may in turn be arranged in arrays and integrated into building structures or otherwise assembled to for large scale conversion of solar energy into electricity by the photovoltaic effect.

Certain photovoltaic cell fabrication processes involve monolithic integration of the cells of a module. For thin film solar modules, this involves depositing thin film materials on a substrate to form a light absorbing layer sandwiched between electrical contact layers. The front or top contact is a transparent and conductive layer for current collection and light enhancement, the light absorbing layer is a semiconductor material, and the back contact is a conductive layer to provide electrical current. In one example of a fabrication process, a metallic back electrical contact layer is deposited on a substrate. A p-type semiconductor layer is then deposited on the back contact electrical contact layer and an n-type semiconductor layer is deposited on the p-type semiconductor layer to complete a p-n junction. Any suitable semiconductor materials, such as CIGS, CIS, CdTe, CdS, ZnS, ZnO, amorphous silicon, polycrystalline silicon, etc. may be used for these layers. A top transparent electrode layer is then deposited on the p-n junction. This layer may be a conductive oxide or other conductive film and is used for current collection. The thin film materials are appropriately scribed with a laser beam to form multiple interconnected cells on the substrate.

SUMMARY OF THE INVENTION

Provided herein are improved methods of laser scribing photovoltaic structures to form monolithically integrated photovoltaic modules. The methods involve forming P1, P2 or P3 scribes by an ablative scribing mechanism having low melting, and in certain embodiments, substantially no melting. In certain embodiments, the methods involve generating an ablation shockwave at an interface of the film to be removed and the underlying layer. The film is then removed by mechanical shock. According to various embodiments, the ablation shockwave is generated by using a laser beam having a wavelength providing an optical penetration depth on the order of the film thickness and a minimum threshold intensity. In one embodiment, Material including an absorber layer is scribed using an infrared laser source with picosecond range pulse width.

One aspect of the invention relates to scribing solar cell layers for monolithic integration schemes. Using lasers having certain wavelengths and pulse widths at empirically optimized fluence levels, laser scribes of solar cell materials including P1, P2, and P3 scribes, can be produced with virtually no melt or particles and hence no shunting. In certain embodiments, the melt-free scribing is due to scribing mechanically via an ablation shockwave produced at the interface of the layer to be removed with the underlying layer. The mechanism is achieved by using a wavelength that gives a long optical penetration depth, on the order of the layer thickness or higher, along with an ultrashort pulse width that provides high peak intensity. In one example, melt-free P2 or P3 scribes are achieved using a laser having an infrared wavelength (e.g., >1000 nm) and a pulse width from 1-20 picoseconds. In certain embodiments, the pulse width is long enough to avoid non-linear absorption. For example, in certain embodiments, pulse widths in between and exclusive of nanoseconds and femtoseconds are used, nanoseconds being too long to achieve the requisite peak intensity and femtoseconds too short, resulting in non-linear absorption.

According to the embodiments, a method of forming monolithically integrated photovoltaic cells involves providing a substrate having a plurality of layers of a thin film photovoltaic stack deposited thereon, identifying a scribe line along the substrate; and passing a laser beam along the scribe line to remove at least one of the plurality of layers along the scribe line, wherein the laser beam is produced from an infrared laser source and has pulse width of between about 1 and 20 picoseconds.

In certain embodiments, the wavelength is about 900 nm, e.g., 980 nm, 1047 nm, 1053 nm, 1060 nm, 1064 nm, 1080 nm, 1150 nm or 1152 nm. The laser may be a Q-switched laser and/or a mode-locked laser, or any other type of pulsed-laser. Examples of laser mediums that may be used include Nd:YAG, Nd:YAP, Nd:glass, Nd:YLF, an argon laser, a HeNe laser, or any other appropriate laser.

In certain embodiments, the at least one layer that is removed is an absorber layer of a photovoltaic stack. In certain embodiments, it is a (CIGS) layer. According to various embodiments, the CIGS or other absorber layer is removed, either alone or with an overlying buffer layer, or buffer and TCO layer, from a back contact layer, such that the back contact layer is left substantially intact exposed along the scribe line. In certain embodiments, the combined thickness of the one or layers removed is at least about 1000 nm.

Another aspect of the invention involves forming monolithically integrated photovoltaic cells by providing a substrate having a plurality of layers of a thin film photovoltaic stack deposited thereon including a top layer and an underlayer, identifying a scribe line along the substrate; and pulsing a laser beam along the scribe line to remove the top layer along the scribe line, while leaving the underlayer intact, where an optical penetration of the laser beam pulses is greater than the thickness of the top layer and wherein the laser beam pulses have a pulse width of no more than about 20 picoseconds.

Another aspect of the invention relates to a method of forming monolithically integrated photovoltaic cells involving providing a substrate having a plurality of layers of a thin film photovoltaic stack deposited thereon, including a top layer and an underlayer; focusing a laser beam at one or more points on the substrate where the top layer is to be removed; and producing a shockwave at an interface between the top layer and the underlayer to thereby remove a portion of the top layer without forming a melt zone in the underlying layer.

These and other aspects of the invention are described further below with reference to the figures.

DETAILED DESCRIPTION

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention. In the following description, numerous specific details are set forth in order to provide a thorough understanding of the present invention. The present invention may be practiced without some or all of these specific details. In other instances, well known mechanical apparatuses and/or process operations have not been described in detail in order not to unnecessarily obscure the present invention.

Provided herein are methods for laser scribing layers of thin film photovoltaic stacks to produce monolithically integrated modules of interconnected solar cells. The methods involve scribing a layer with virtually no melting or particle production, eliminating common causes of cell shunting. According to various embodiments, the methods employ laser beams having wavelengths and pulse widths that have been shown to provide scribes without melting or particles. Without being bound by any particle theory, it is believed that the laser beams scribe via a mechanical shockwave mechanism. In one example, lasers having an infrared wavelength (e.g., 1064 nm) and approximately 10-15 picoseconds pulse width scribe produce P1, P2 and P3 scribes in CIGS solar cell structures, with virtually no melt zones. Detailed description of achieving such scribes for a variety of thin film materials is provided further below.

Figure 1A:
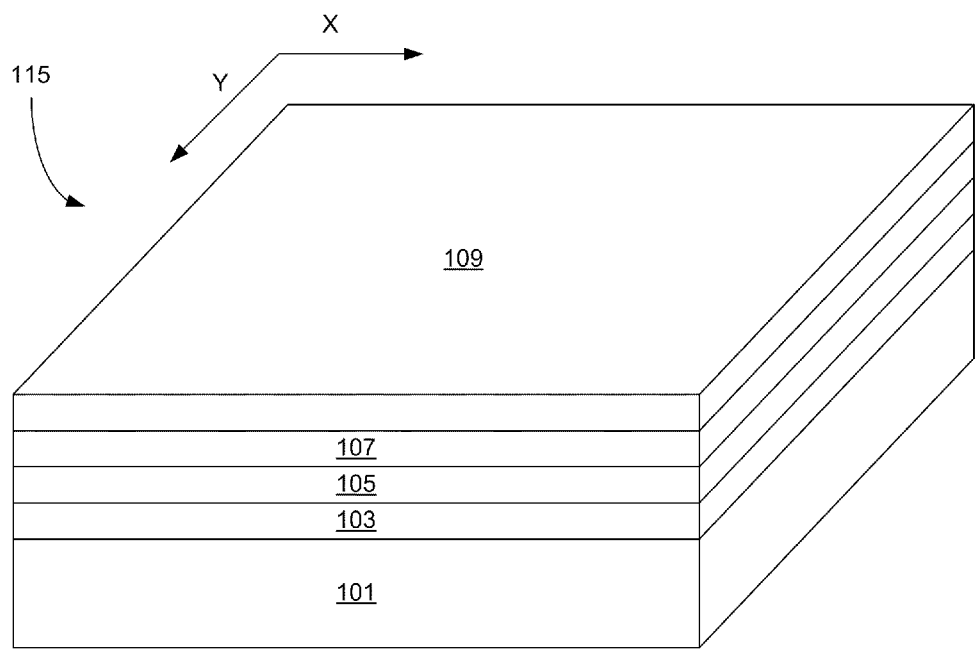
FIG. 1A is a schematic illustration of a substrate having thin film photovoltaic materials deposited thereon according to certain embodiments.

Solar module fabrication often involves depositing thin films on relatively large area substrates. Individual cells are then produced from the substrates having thin film materials deposited thereon. Laser scribing of thin film photovoltaic layers to form individual cells eliminates the need to mechanically cut the substrate and reconnect the formed cells in series. FIG. 1A shows a perspective view of an example of a substrate 101 supporting thin films 103, 105, 107 and 109 that together form thin film photovoltaic stack 115. For the purposes of illustration, the figure is not to scale; for example, thickness of the substrate may be on the order of mils, the thickness of the thin film stack on the order of microns (or hundredths of mils) with the x- and y-dimensions of the substrate on the order of feet. Substrate 101 provides mechanical support for the thin film materials, and is generally an insulator such as silicon dioxide, glass or other material. In certain embodiments, substrate 101 may include a metal or conductive substrate coated with silicon dioxide layer or other insulator.

Back electrical contact layer 103 provides electrical contact to allow electrical current to flow through the photovoltaic cell, and may be made of any appropriate material, e.g., molybdenum, niobium, copper, silver, aluminum, etc. A p-type semiconductor layer 105 is deposited on back electrical contact layer 103 and an n-type semiconductor layer 107 is deposited on p-type semiconductor layer 105 to complete a p-n junction. According to various embodiments, any suitable semiconductor materials, such as CIGS, CIS, CdTe, CdS, ZnS, ZnO, amorphous silicon, polycrystalline silicon, etc. are used for layers 105 and 107. For example, the p-type semiconductor layer 105 may be CIGS or CIS, and the n-type semiconductor layer 107 may be CdS or a cadmium free material, such as ZnS, ZnO, etc. Layer 105 may also be referred to as an absorber layer, and layer 107 as a buffer layer. Front transparent electrical contact layer 109 is deposited on the p-n junction. In certain embodiments, front transparent electrical contact layer 109 is a transparent conducting oxide (TCO), for example, zinc oxide, aluminum-doped zinc oxide (AZO) and indium tin oxide (ITO). FIG. 1A shows an example of a thin film stack on a substrate; other materials may be used in addition to or instead of any of these materials. In certain embodiments, thin film layers are deposited on a front transparent substrate, with the front electrical contact layer deposited on the transparent substrate, followed by absorber layers and the back electrical contact layer.

Figure 1B:
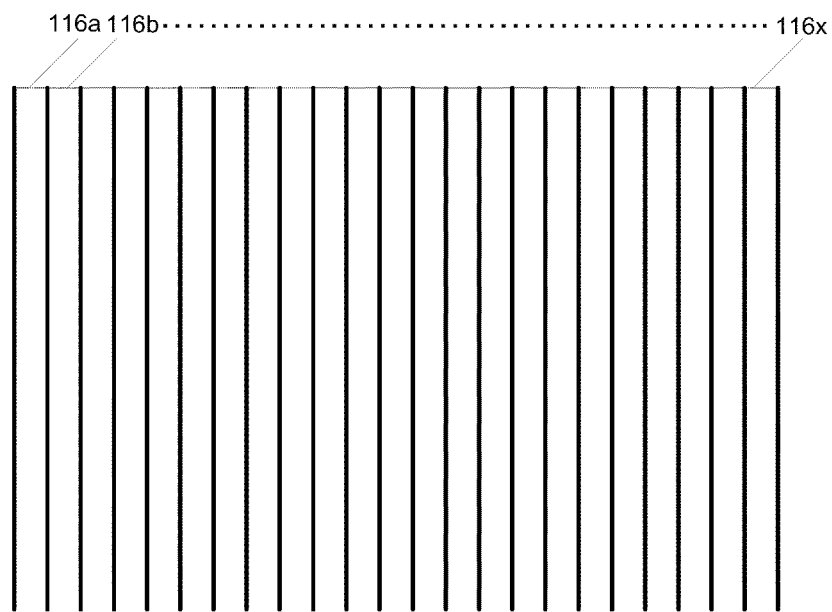
FIG. 1B is a schematic illustration of a top view of a monolithically integrated module.

FIG. 1B shows a top view of cells of monolithically integrated module: instead of a single large area photovoltaic stack, scribe lines are used to create multiple cells 116, 116b . . . 116x, connected in series, with the front electrical contact of each layer connected to the back electrical contact of the adjacent layers (not shown). The inventive methods may be used to scribe lines from the front or back, with the laser beam incident on an exposed film or through a transparent substrate.

Figure 2:
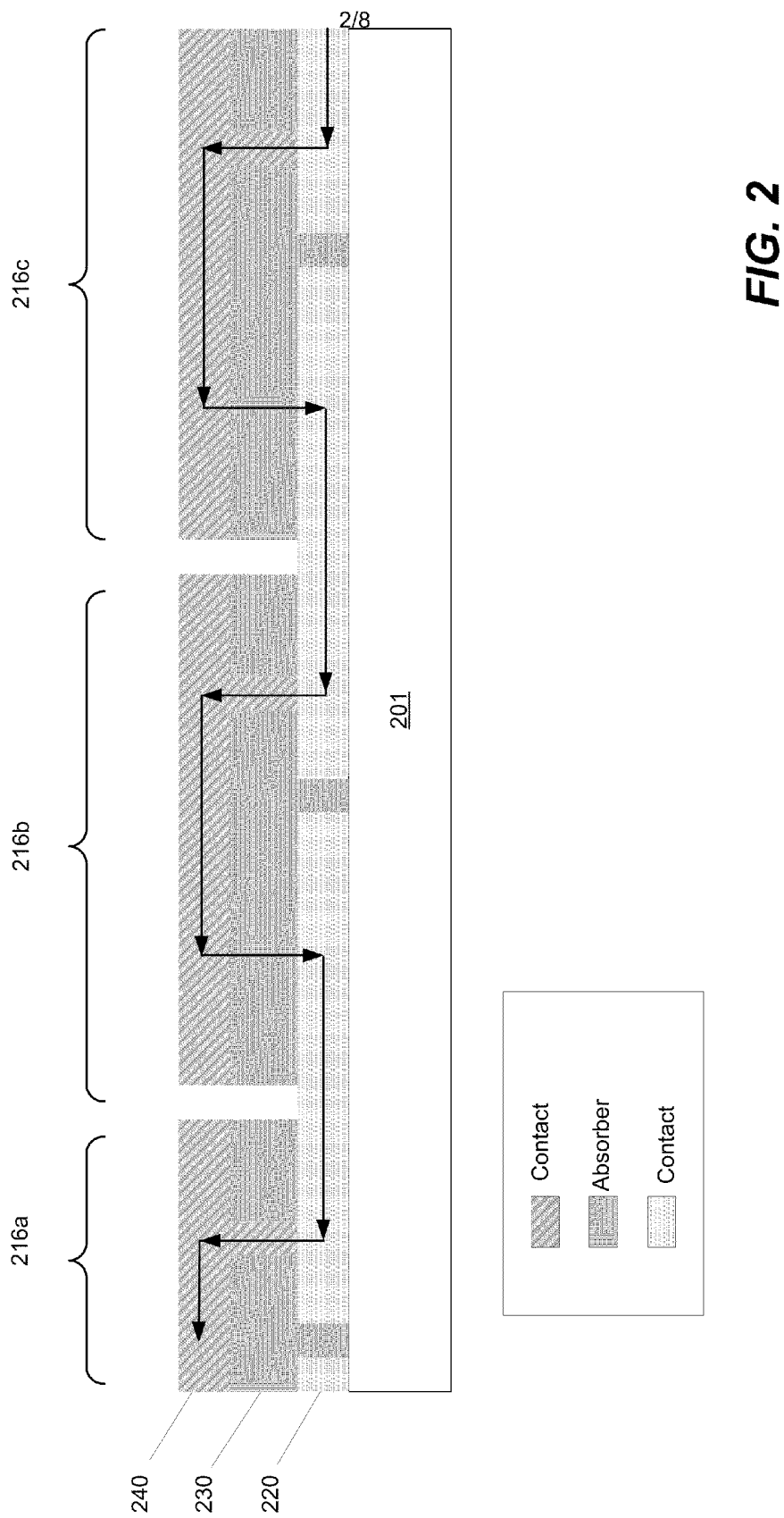
FIG. 2 is a schematic illustration of cross-sectional view of a portion of a monolithically integrated module, including interconnected cells.

FIG. 2 shows a cross-sectional view of a portion of a monolithically integrated module, including cells 216a (partially shown), 216b and 216c. Substrate 201 supports thin films 220, 230 and 240: films 220 and 240 represent electrical contact layers, and 230 absorber and buffer layers sandwiched between the contact layers 220 and 240. In certain embodiments, film 220 is a TCO layer and substrate 201 is a glass or other transparent substrate, and film 240 a back contact layer. Absorber and buffer layers 230 include p-type and n-type semiconductor layers as described above. In other embodiments, film 220 is a back contact layer and 240 a front contact layer, with substrate 201 transparent or non-transparent. Cells 216a, 216b and 216c are connected in series, with the current path generally indicated by the black arrow.

Example thicknesses of semiconductor junctions are between about 500 nm to 3000 nm, for example, between about 1500 nm and 2000 nm. Example thicknesses of TCO layers are between about 100 nm to 1000 nm, for example between about 200 nm and 800 nm. Example thicknesses of back contact layers are between about 100 and 1000 nm, for example between about 100 and 500 nm. The scribing techniques described herein are not limited to any particular thickness, however, so long as the appropriate laser wavelength for a particular thickness is used as described further below.

Figure 3:
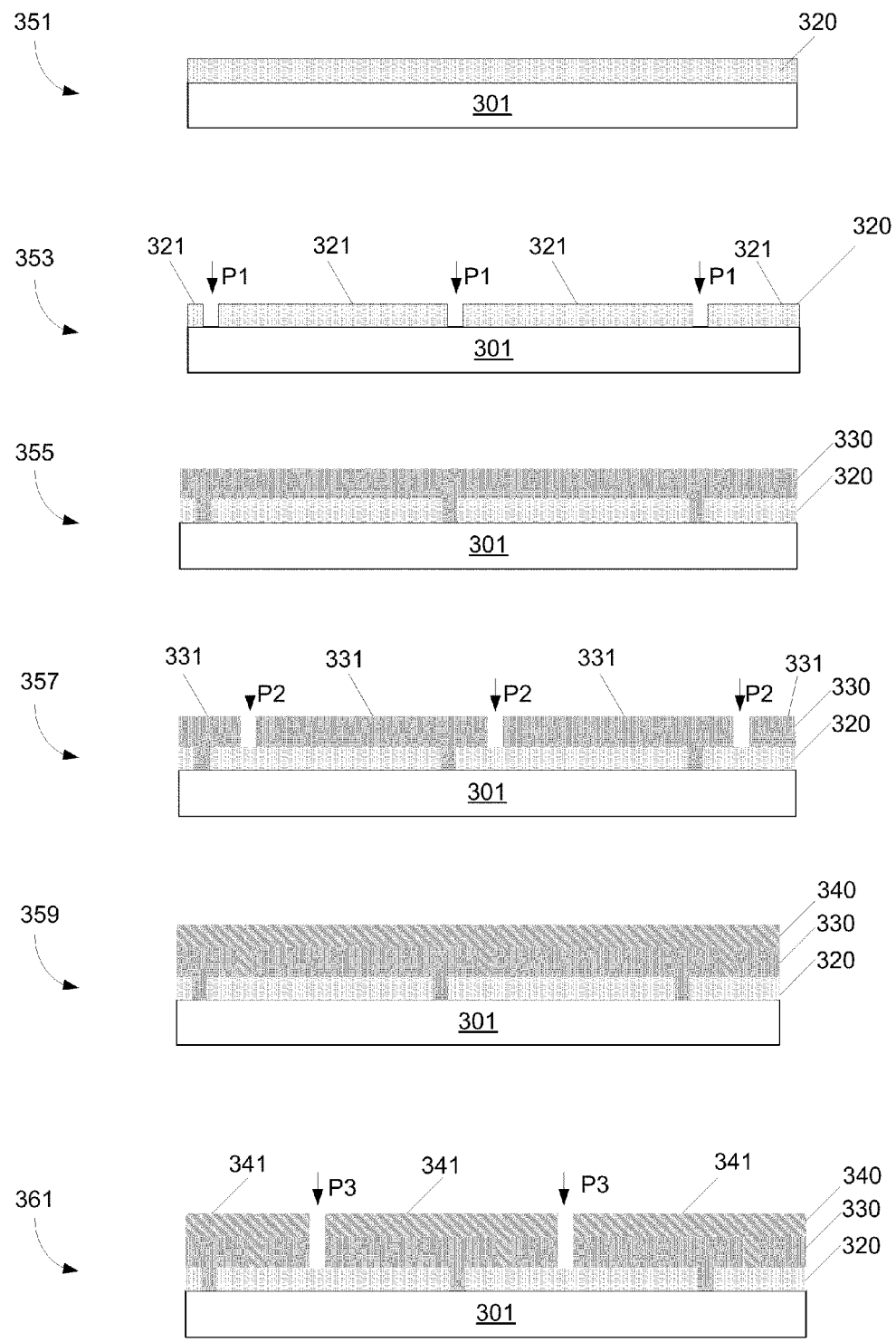
FIG. 3 is a schematic illustration of a solar module at various stages of a monolithic integration process including P1, P2 and P3 scribes according to various embodiments.

Cross-sectional schematics showing various operations in a method of fabricating a module as shown in FIG. 2 are shown in FIG. 3. At 351, a first contact layer 320 is deposited on substrate 301. As indicated above, in many embodiments, first contact layer 320 is a TCO layer and substrate 301a glass substrate, though this is not necessarily the case. At 353, a P1 scribe is illustrated: the P1 scribe removes the contact layer from substrate 301 along scribe lines that extend the width of the substrate (not shown) to divide the film into parallel electrodes 321. Semiconductor materials, such as CIGS/CdS, amorphous silicon, etc., are then deposited, creating a film 330 as shown at 355. (The film 330 may refer to multiple thin films, e.g., a CIGS film and CdS film). The materials fill in the grooves created by the P1 scribe, insulating the electrodes made of first contact layer 320. A P2 scribe is illustrated at 357. The P2 scribe removes the absorber film 330 from the contact film along scribe lines that extend the width of the substrate (not shown) to divide the absorber film into a plurality of parallel photovoltaic elements 331. A second contact layer 340 is then deposited on the absorber film 330 at shown at 359. As discussed above, in certain embodiments, this may be a molybdenum, aluminum, copper, etc. film used as a back contact. The second contact layer 340 is electrically connected to electrodes 321. At 361, a P3 scribe is shown. The P3 scribe is shown removes both the absorber film 330 and the second contact layer 340 along scribe lines that extend the width of the substrate (not shown) to divide the conductive film into a plurality of parallel electrodes 341, and forming the series connected photovoltaic cells as depicted in FIG. 2.

Figure 4:
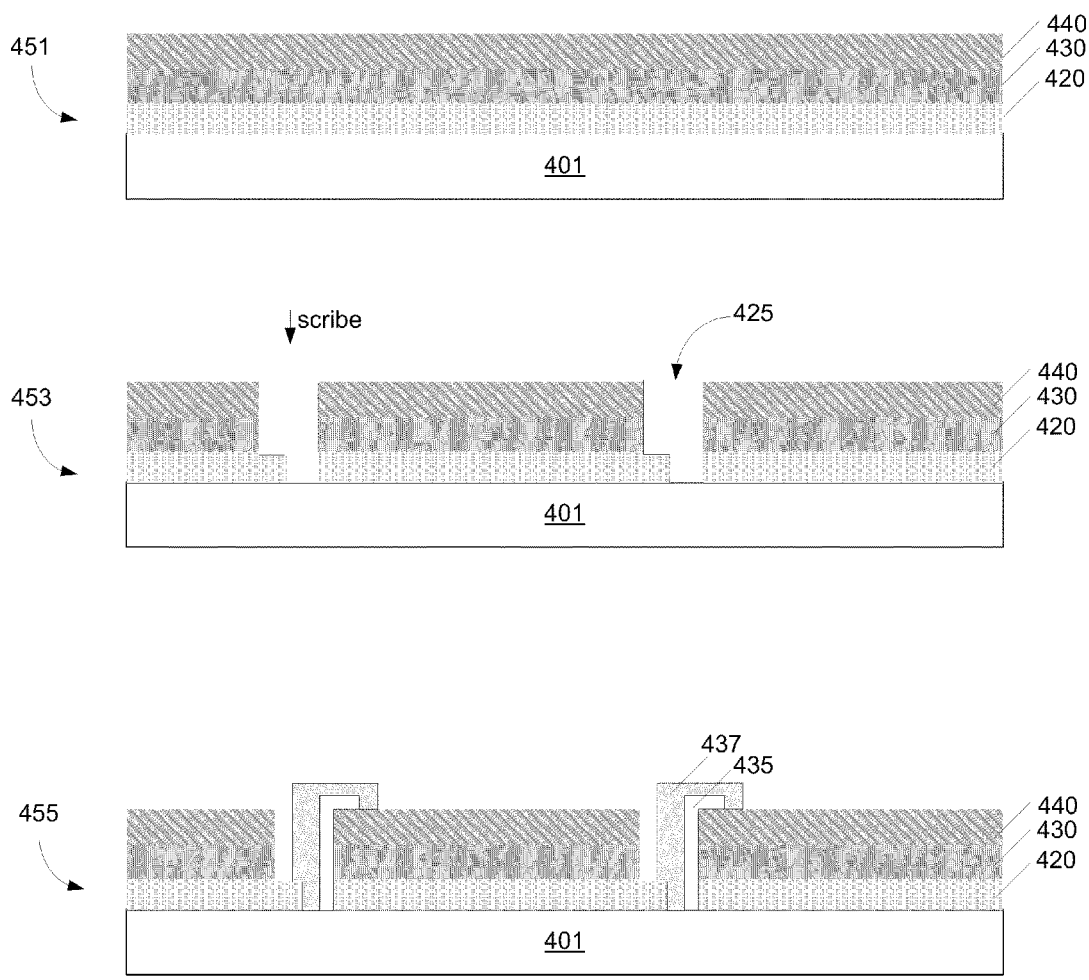
FIG. 4 is a schematic illustration of a solar module at various stages of another monolithic integration process according to various embodiments.

FIG. 4 provides another example of a monolithic integration process employing laser scribing, in which first contact layer 420, absorber/buffer layers 430 and second contact layer 440 are deposited on a substrate 401. In one example, substrate 401 is a silicon oxide coated substrate, first contact layer is a back contact film such as molybdenum and second contact layer is a TCO layer. The as deposited stack is shown at 451. At 453, stepped scribed line profiles 425 are shown. These profiles may be created by sequential scribes, one removing the second contact layer 440 and absorber layer 430, and the second removing second contact layer 440, absorber/buffer layers 430 and first contact layer 420. In other embodiments, a single laser scribe may be used to form the stepped profile. Such methods are described in U.S. patent application Ser. Nos. 12/904,944 and 12/904,958 incorporated by reference herein. The (photovoltaic stack is divided by the stepped scribed lines into a plurality of photovoltaic cells. Cell interconnection is illustrated at 455, with an insulator 435 and conductor 437 deposited to interconnect the cells in series.

While FIGS. 2-4 provide examples of integration processes for monolithically integrated solar cells, the inventive scribing processes described below are not limited to these particular processes but may be used with other solar module integration processes that employ laser scribing.

As indicated above, the inventive methods described herein provide reduced melt and particle scribing. In conventional scribe processes, film is removed by a mechanism that includes melting: laser pulse energy is absorbed, leading to temperature increase, which in turn leads to thermal expansion and melting. Laser energy on the molten material in turn causes splatter, which when solidifies results in particles welded to other layers. The solidified melt pools and particles can be a major cause of shunt formation between front and back contacts in a cell, which is detrimental to device performance.

In the methods described herein, scribing is performed with reduced, and in certain embodiments, virtually no melting or particle formation. For example, using ultra short picosecond pulse laser beams of certain wavelengths and pulse widths, P1, P2 and P3 scribes in CIGS solar structures are produced without melting or particles associated with typical scribing processes. Specifically, it was found that at 1064 nm and picosecond range (12-15 picoseconds), the overlying film is removed with virtually no melting or particles for P3 as represented in FIG. 3. P1 scribing of molybdenum coatings on a rigid glass plates using 1064 nm and a picosecond range pulsewidth also produced scribe lines with virtually no melting or particles.

Without being bound by a particular theory, it is believed that the improved scribing is due to producing the scribes via a shockwave produced at the interface of the layer to be removed and the underlying layer. This mechanism, possible only by selecting the right wavelength and peak intensity of the laser beam, is dominated by mechanical removal without melting or vaporizing.

To produce an ablative shockwave that removes a top layer without melting, the following conditions are met: 1) the laser beam has a wavelength that provides an optical penetration depth on the order of, or in certain embodiments, greater than the thickness of the top layer, 2) the absorption coefficient of the underlying layer at that wavelength is greater than a threshold minimum necessary for the underlying layer to absorb the energy to produce the shockwave, and 3) the pulse width is small enough to provide the requisite intensity to produce the shockwave, but not so small that it results in non-linear absorption in the top overlying layer.

Optical penetration depths for various example solar cell layers and laser beam wavelengths are provided below in Table 1. The optical penetration depth is calculated as follows:

Optical penetration depth=$1/\alpha=\lambda/(4\pi k)$ where $\alpha$ is the absorption coefficient, lambda is the wavelength and k is the extinction coefficient for the material and wavelength:

TABLE 1

Optical penetration depths for various solar cell layers

| Layer | Material | Wavelength (nm) | Extinction Coefficient | Optical Penetration Depth (nm) |
|---|---|---|---|---|
| Back contact | Mo | 354 | 3.2 | 9 |
| | Mo | 1033 | 4.2 | 19 |
| Absorber | CIGS | 400 | 1 | 32 |
| | CIGS | 500 | 0.1 | 398 |
| | CIGS | 1000 | 0.01 | 7957 |
| | CIGS | 1040 | 0.005 | 16552 |
| | A-Si | 413.567 | 1.9 | 17.321 |
| | | 516.958 | 0.78 | 52.741 |
| | | 1033.9 | 0.01 | 8227.648 |
| | GaAs | 413.567 | 2 | 16.455 |
| | | 516.958 | 0.42 | 97.948 |
| | | 1033.9 | 0.02 | 4113.824 |
| | CdTe | 413.567 | 0.861 | 38.223 |
| | | 516.958 | 0.38 | 108.259 |
| | | 1033.9 | 0.00241 | 34139.619 |
| Buffer | CdS | 400 | 0.18 | 176 |
| | | 500 | 0.008 | 4974 |
| | | 1040 | 0.005 | 16552 |
| | ZnS | 413.567 | 0.15 | 219.404 |
| | | 516.958 | ~0 (virtually transparent) | |
| | | 1033.9 | ~0 (virtually transparent) | |
| Top contact | AZO | 400 | 0.045 | 707 |
| | AZO | 850 | 0.015 | 4509 |
| | ITO | 355 | 2.23 | 13 |
| | ITO | 1033 | 7.56 | 11 |

Table 1 presents examples of optical penetration depths for wavelengths in typical solar cell layers. The methods of the invention are not limited to these wavelengths or materials, however, but may be applied with any laser beam and material. Determining laser beam wavelength that can be used in the methods described herein to produce an ablative shockwave may be done with reference to Table 1 or by determining an optical penetration depth for a particular material and wavelength. For example, to remove a CIGS layer of 1000 nm, Table 1 shows that wavelengths of 1000 nm or 1040 nm may be used (both having optical penetration depths greater than 1000 nm).

Multiple layers may be scribed simultaneously, if they are transparent at the laser beam wavelength and the optical penetration depth exceeds that stack thickness. For example, in one embodiment, a TCO/buffer layer/absorber layer stack is scribed with a 1064 nm, leaving an underlying back contact layer. For the purposes of this description a top layer or overlayer may include multiple layers that are optically transparent at a particular wavelength. Optical transparency may be characterized by the extinction coefficient, k, which characterizes absorption of electromagnetic energy of a wave propagating through a material. As indicated above, k is $\alpha$ ($\lambda/(4\pi k)$). Transparent materials are characterized by k close to zero, and a corresponding high optical penetration depth.

Optical penetration for a stack may be determined by measurement and/or by computational methods. One such computational method is described in Bennett and Booty, "Computational Method for Determining n and k for a Thin Film from the Measured Reflectance, Transmittance and Film Thickness," Applied Optics, Vol. 5, Issue 1, pp. 41-43 (1966), incorporated by reference herein. In other embodiments, the optical penetration depth of a stack is estimated from the optical parameters of one or more of the layers of the stack.

In addition to the optical penetration depth of the laser being at least on par with the overlying layer, the underlying layer must absorb enough energy for the shockwave to be generated. As an initial matter, the laser wavelength is one at which the underlying material is not transparent. The extinction coefficient of the underlying layer is higher than that of the overlying layer. In certain embodiments, a shockwave threshold fluence, i.e., a minimum fluence (energy density) at which a shockwave is generated in a particular underlying material for a particular wavelength is determined. The threshold fluence is related to the absorptiveness of the material: the more absorptive a material is, the lower the threshold fluence.

In certain embodiments, the threshold fluence necessary to generate a shockwave may be estimated by using the ablation threshold as a proxy. The terms ablation threshold and damage threshold are used to refer to different phenomena, but often refer to the minimum fluence or energy density that causes a visible surface modification of a material. This minimum fluence for a material may be used to estimate the minimum fluence necessary to cause a shockwave in an underlying layer of that material.

Figure 5:
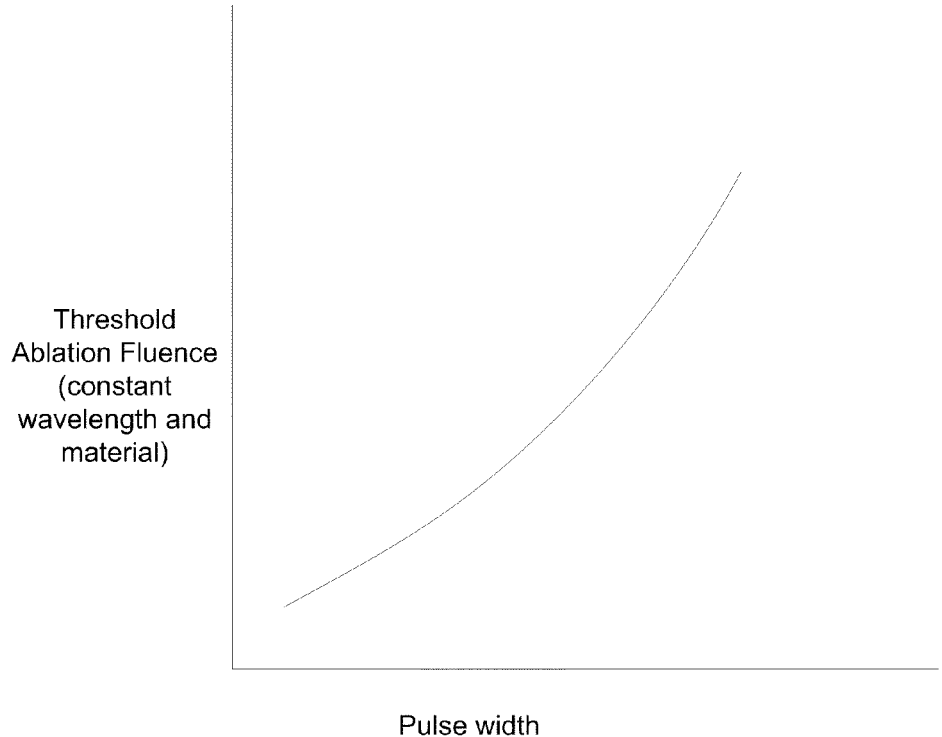
FIG. 5 is a qualitative representation of the relationship between ablation threshold and pulse widths in certain embodiments.

The ablation threshold fluence depends on wavelength, pulse duration and material, and can be determined empirically, by simulation or found in literature. In certain embodiments, it may not be necessary to formally determine an ablation threshold, or more closely, a threshold fluence to generate a shockwave. FIG. 5 shows a qualitative relationship between ablation threshold fluence and pulse width according to certain embodiments. For certain materials and laser wavelengths, a threshold ablation fluence increases as the pulse width (or pulse duration) increases. If the requisite optical penetration depth is used, and no scribing is achieved, it may indicate the laser fluence is too low. One way to increase laser fluence is to increase the laser energy per pulse or reduce the spot size. The threshold fluence can be decreased by decreasing the pulse width. However, as described more fully below, ultrashort pulse (femtosecond range) widths may not produce melt-free scribing due to non-linear absorption that may result.

Figure 6:
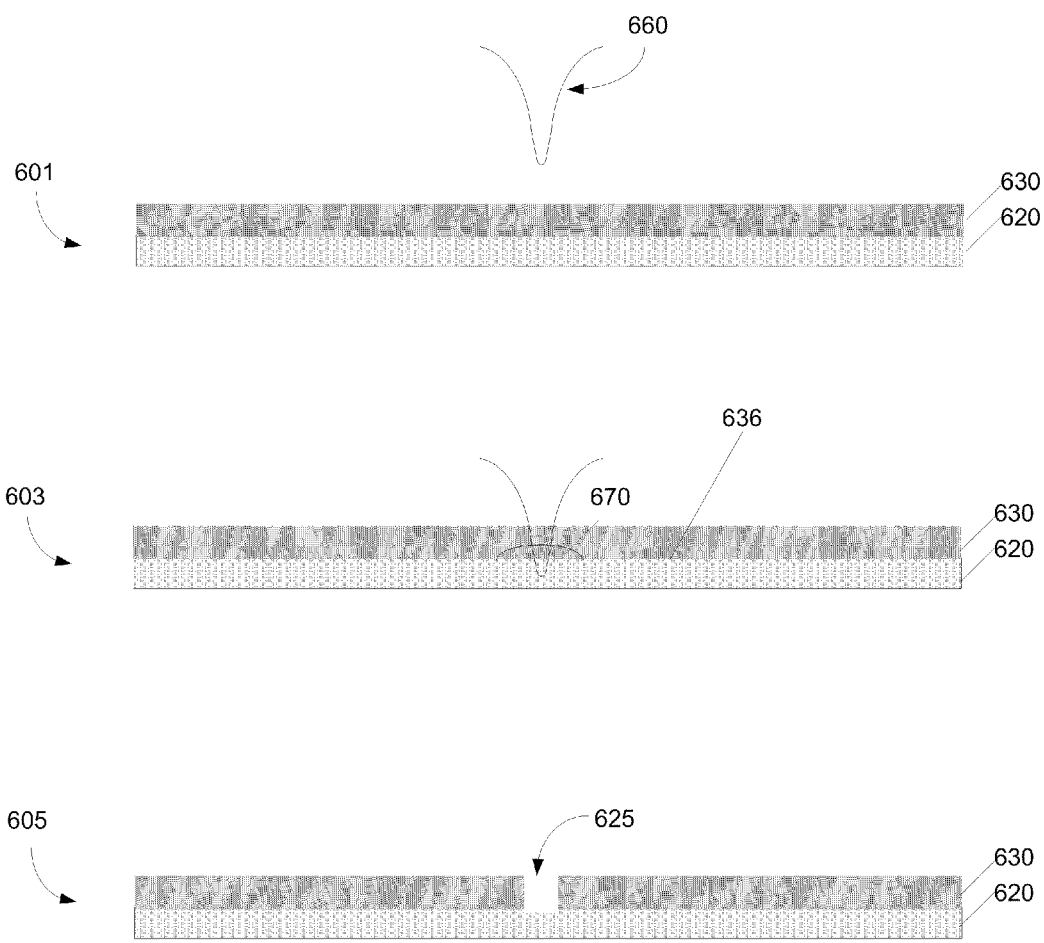
FIG. 6 is a schematic illustration of scribing via an ablative shockwave according to various embodiments.

The principle of removal according to embodiments of the invention is illustrated schematically in FIG. 6: at 601, a laser beam 660 having a Gaussian intensity distribution is directed at a top layer, e.g., a CIGS or CIGS with CdS and TCO layer 630 and an underlying layer 620, e.g., a Na-doped Mo layer. At 603, due to the long optical penetration depth, the laser acts on the underlying layer 620. A shockwave 670 forms at the interface 635 between layers 620 and 630. The shockwave 670 grows. At 605, the material in the top layer 630 is removed by mechanical shock due to the shockwave 670, leaving scribed line 625. Even with an initial pulse or two, the incident energy is already acting on the underlying layer and causing ablation at the underlying interface, producing a shockwave that results in removing the overlying layer by mechanical shock. The underlying layer is left substantially intact and is continuous.

It should be noted that scribing may be performed at wavelengths less than those that provide the optical penetration depths on the same or as or greater than the layer to be removed. However, melting will occur due to the top layer absorbing the incident energy. If wavelengths longer than the optical penetration depths are used, it may be too long for the underlying layer such that the ablative shockwave effect is not achieved or the ablation on the on the underlying layer is not as efficient in terms of threshold and effective in producing the shockwave. Accordingly, in certain embodiments, the wavelength is on the same order of magnitude as the optical penetration depth. In other embodiments, it may longer.

While an optical penetration depth large enough to act on the underlying layer is a prerequisite for the ablative shockwave removal mechanism illustrated in FIG. 6, the peak intensity of the laser pulse must also be appropriately chosen to produce the ablative shockwave. Peak intensity of the laser pulse is inversely correlated to the pulse width:

Peak intensity=(Peak Power)/Spot area

Peak power=Energy/(full-width half max pulse width)

(This represents one way to define peak power. Base-to-base pulse-width or 90% pulse-width are examples of other ways to refer to pulse width that can b used in the formula for peak power.)

Below a threshold pulse-width for a particular laser energy and spot size, the peak intensity is not high enough to generate a shockwave. Scribing a CIGS/CdS/TCO layer having a thickness on the order of 1000 nm with a wavelength of 1064 nm was attempted using pulse widths of nanoseconds ($10^{-9}$) and picoseconds ($10^{-12}$). (Descriptions of pulse widths in these units include tens of the each units, e.g., tens of picoseconds). It was found that even with a wavelength of 1064 nm (and thus the requisite optical penetration depth) melt-free scribing was obtained only with pulse widths in the picosecond range. Without being bound by a particular theory, it is believed that for the CIGS-containing layer, pulse widths in the nanosecond and femtosecond ranges do not produce ablation shockwaves. In the nanosecond range, the peak intensity of the pulse is not high enough to produce the shockwave. However, if the pulse width were decreased too much, e.g., into the femtosecond range, non-linear absorption would occur due to the extremely high peak intensities. Due to the strong absorption, the optical penetration depth does not extend beyond the CIGS layer to produce the same mechanism.

Experimental

P3 scribes on a stainless steel (SST)/Mo/CIGS/CdS/TCO stack were performed at 355 nm, 532 nm, and 1064 nm. The total thickness of the CIGS/CdS/TCO layers (i.e., the material to be removed) was about 2000 nm, with the CIGS layer over about 1000 nm. For each wavelength, laser fluence (energy) level, scan speed, and passes were optimized based on line width consistency, depth and cleanliness of the scribe. The scribes were also observed for evidence of melting by focused ion beam/scanning electron microscopy (FIB/SEM) after cross-sectioning a scribe. A pulse repetition rate of 200 kHz and a pulse width of 12 picoseconds were employed for all scribes.

Figure 7A:
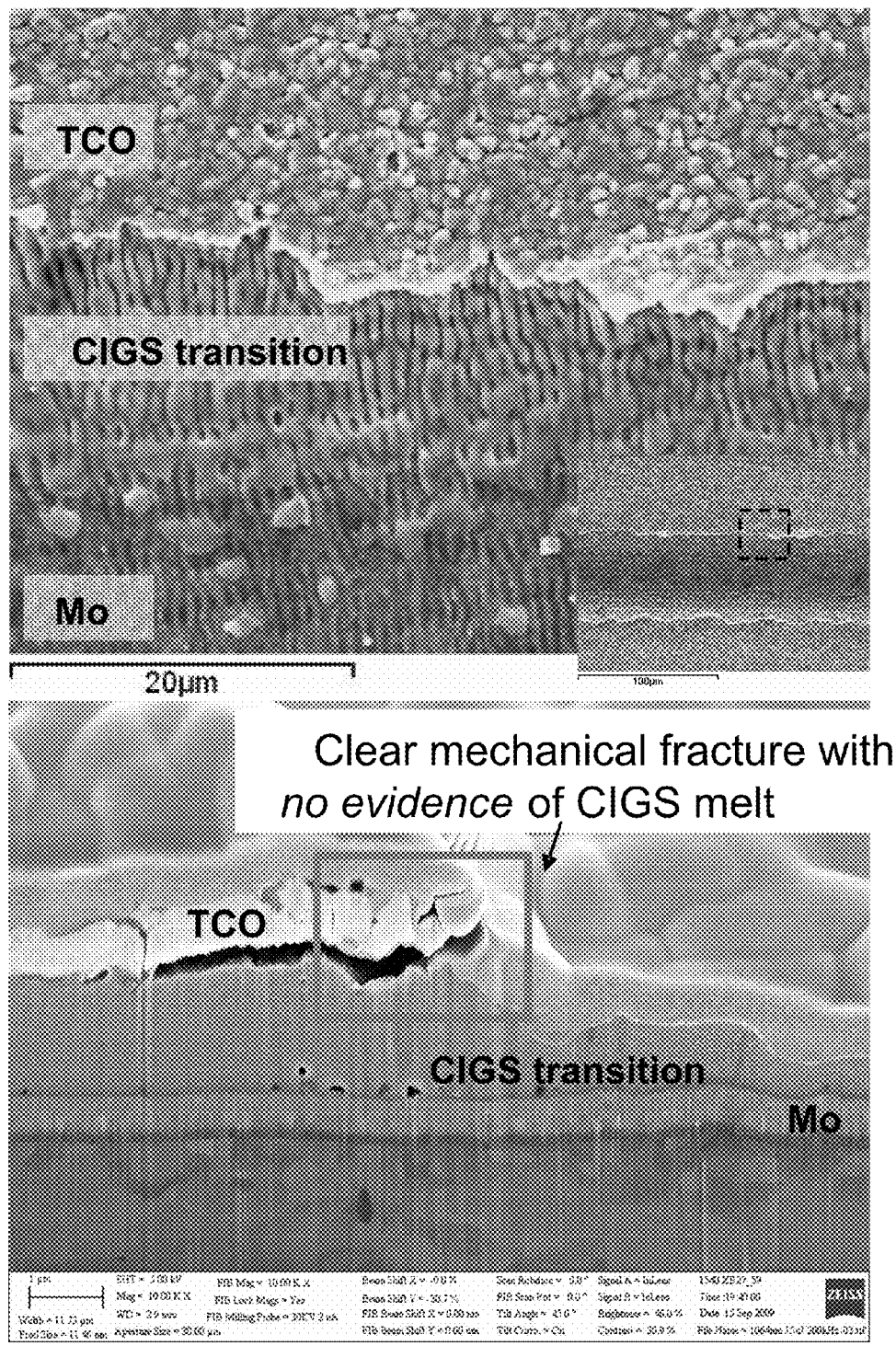
FIG. 7A presents representative FIB/SEM images of scribed solar cell structure exhibiting clear mechanical ablation and no melting.
Figure 7B:
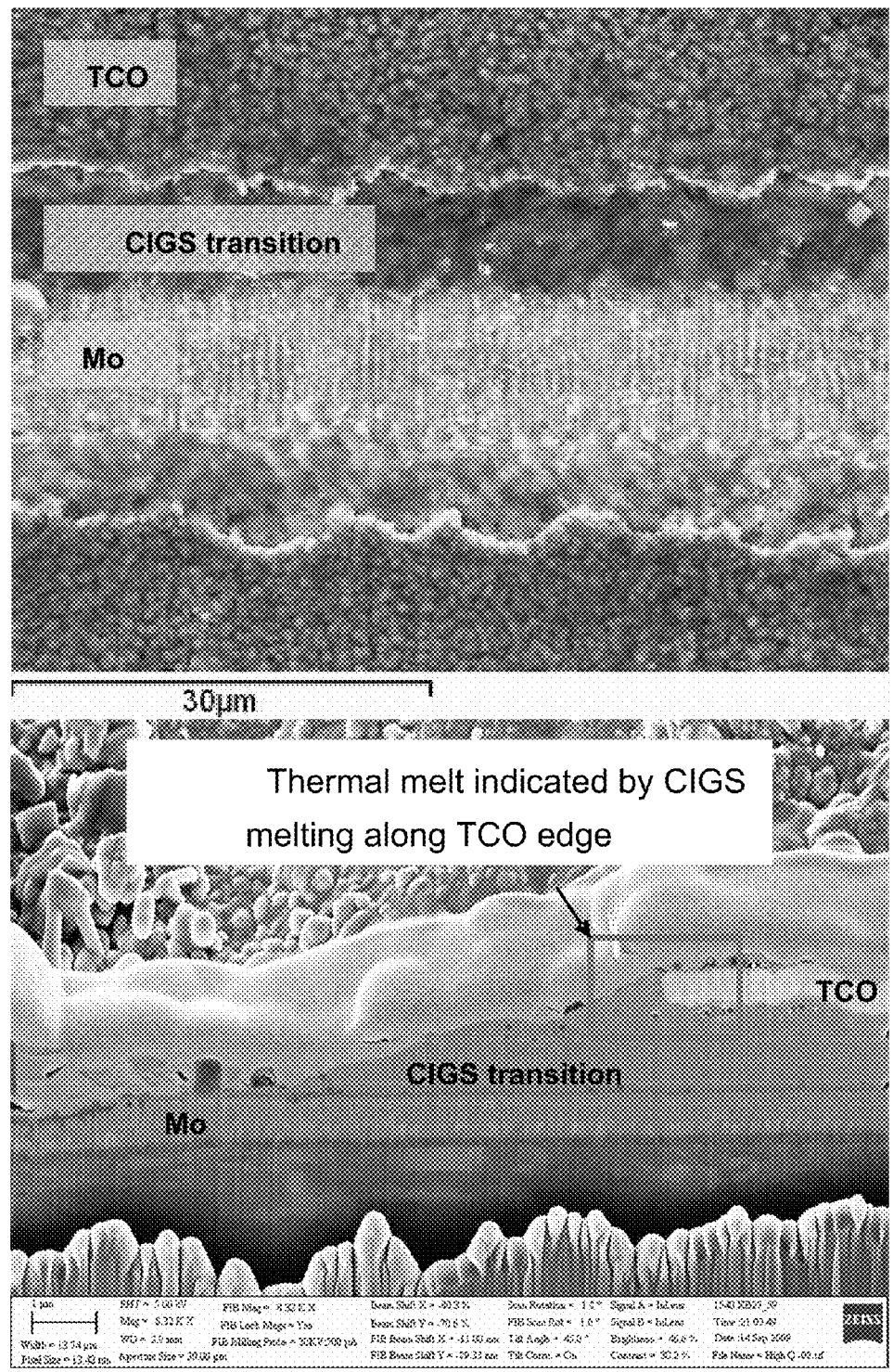
FIG. 7B presents representative FIB/SEM images of scribed solar cell structure exhibiting melting.

FIG. 7A provides representative FIB/SEM images of a cross-section of a scribed solar cell stack that is observed to have passed, while FIG. 7B provides representative FIB/SEM images of a cross-section of a scribed solar cell stack that is observed to have failed. As seen in FIG. 7A, the TCO layer is mechanically separated from the CIGS layer, with no signs of melt. In FIG. 7B, CIGS melting along the TCO edge is observed. There is no sign of mechanical separation. Pass/fail data is provided below in Table 2.

TABLE 2

P3 scribes

| Scribe No. | Wavelength (nm) | Energy (uJ) | Passes | Speed (m/s) | Depth | Note | Pass/Fail |
|---|---|---|---|---|---|---|---|
| 1 | 1064 | 5 | 1 | 0.2 | Moly | Very clean TCO ablation | Pass |
| 2 | 1064 | 5 | 1 | 1 | CIGS | | Fail |
| 3 | 1064 | 5 | 3 | 0.2 | Fe/Cr (steel substrate) | Very clean TCO ablation | Fail |
| 4 | 1064 | 5 | 3 | 1 | Moly | Moly not continuous and defined | Fail |
| 5 | 1064 | 20 | 1 | 2 | CIGS | | Fail |
| 6 | 1064 | 20 | 1 | 6 | Moly | Moly not continuous and defined | Fail |
| 7 | 1064 | 10 | 1 | 2 | CIGS | | Fail |
| 8 | 1064 | 10 | 1 | 6 | CIGS | | Fail |
| 9 | 1064 | 10 | 1 | 0.2 | Fe/Cr | Very clean TCO ablation | Fail |
| 10 | 1064 | 10 | 1 | 1 | CIGS | | Fail |
| 11 | 1064 | 10 | 3 | 0.2 | Fe/Cr | | Fail |
| 12 | 1064 | 10 | 3 | 1 | Moly | Very Clean TCO ablation | Pass |
| 13 | 532 | 10 | 3 | 1 | Moly | Very Clean TCO ablation | Pass |
| 14 | 532 | 12 | 1 | 0.3 | CIGS | | Fail |
| 15 | 532 | 12 | 2 | 0.3 | Moly | TCO cracking; evidence of melt | Pass |
| 16 | 532 | 12 | 4 | 1 | Moly | TCO cracking; evidence of melt | Pass |
| 17 | 532 | 12 | 6 | 1 | Moly | TCO cracking; evidence of melt | Pass |
| 18 | 532 | 15 | 2 | 0.3 | Moly | TCO cracking; evidence of melt | Pass |
| 19 | 532 | 15 | 4 | 0.3 | Fe/Cr | TCO cracking; evidence of melt | Fail |
| 20 | 355 | 10 | 1 | 2 | CIGS | | Fail |
| 21 | 355 | 10 | 1 | 4 | CIGS | | Fail |

Scribes able to successfully scribe down to the Mo layer were deemed to have passed. Only 1064 nm (scribe nos. 1 and 12) and 532 nm (scribe nos. 13, 15, 16, 17 and 18) lasers successfully scribed down to the Mo layer. Of these, only the 1064 nm scribe lines displayed no evidence of melting. Evidence of melting is most pronounced for 355 nm, followed by the 532 nm. The scribe at 1064 produces very clean lines in the TCO layer, showing no evidence of melting. P3 scribes were also performed using a 1064 nm nanosecond laser. Cracks and melting residues were observed.

Although the foregoing invention has been described in some detail for purposes of clarity of understanding, it will be apparent that certain changes and modifications may be practiced within the scope of the invention. It should be noted that there are many alternative ways of implementing both the processes and apparatuses of the present invention. Accordingly, the present embodiments are to be considered as illustrative and not restrictive, and the invention is not to be limited to the details given herein.

What is claimed is:

1. A method of forming monolithically integrated photovoltaic cells, the method comprising:
    providing a substrate having one or more layers of a thin film photovoltaic stack deposited thereon,
    identifying a scribe line along the substrate; and
    passing a laser beam along the scribe line to remove at least one of the one or more layers along the scribe line, wherein the laser beam is passed along the front side of the substrate such that it is incident on an exposed one of the one or more layers of the thin film photovoltaic stack, wherein the laser beam is produced from an infrared laser source and has pulse width of between about 1 and 20 picoseconds, and wherein the removal is melt-free.

2. The method of claim 1 wherein the laser beam has a pulse width of about 12-15 picoseconds.

3. The method of claim 1 wherein the wavelength of the laser beam is greater than about 1000 nm.

4. The method of claim 1 wherein the one or more layers includes a copper indium gallium selenide (CIGS) layer.

5. The method of claim 4 wherein the CIGS layer is removed along the scribe line.

6. The method of claim 4 wherein the plurality of layers includes a molybdenum (Mo) layer underlying the CIGS layer.

7. The method of claim 6, passing a laser beam along the scribe line removes the CIGS layer along the scribe line while leaving the Mo layer substantially intact along the scribe line.

8. The method of claim 3 wherein the CIGS layer is at least about 1000 nm thick.

9. The method of claim 1 wherein the scribe line is a P1 scribe line.

10. The method of claim 1 wherein the scribe line is a P2 scribe line.

11. The method of claim 1 wherein the scribe line is a P3 scribe line.

12. A method of forming monolithically integrated photovoltaic cells, the method comprising:
provoding a substrate having a plurality of layers of a thin film photovoltaic stack deposited thereon including a top layer and an underlayer,
identifying a scribe line along the substrate; and
pulsing a laser beam along the scribe line to remove the top layer along the scribe line, while leaving the underlayer intact, wherein the laser beam is passed along the front side of the substrate such that it is incident on an exposed one of plurality of layers of the thin film photovoltaic stack,
wherein an optical penetration of the laser beam pulses is greater than the thickness of the top layer, wherein the laser beam pulses have a pulse width of no more than about 20 picoseconds, and wherein the removal is melt-free.

13. The method of claim 12 wherein the thickness of the top layer is at least about 1000 nm.

14. The method of claim 12 wherein the top layer is or includes an absorber layer of the photovoltaic stack.

15. The method of claim 12 wherein the top layer includes copper indium gallium selenide (CIGS).

16. The method of claim 12 wherein the top layer is an amorphous silicon layer.

17. The method of claim 12 wherein the top layer is a cadmium telluride (CdTe) layer.

18. The method of claim 12 wherein the scribe line is a P1 scribe line.

19. The method of claim 12 wherein the scribe line is a P2 scribe line.

20. The method of claim 12 wherein the scribe line is a P3 scribe line.

21. A method of forming monolithically integrated photovoltaic cells, the method comprising:
providing a substrate having a plurality of layers of a thin film photovoltaic stack deposited thereon, including a top layer and an underlayer;
focusing a laser beam at one or more points on the substrate where the top layer is to be removed, wherein the laser beam is on the front side of the substrate such that it is incident on an exposed one of plurality of layers of the thin film photovoltaic stack; and
producing a shockwave at an interface between the top layer and the underlayer to thereby remove a portion of the top layer without forming a melt zone in the underlying layer.

22. The method of claim 1 wherein the substrate is a stainless steel substrate.

23. The method of claim 12 wherein the substrate is a stainless steel substrate.

24. The method of claim 21 wherein the substrate is a stainless steel substrate.

* * * * *